United States Patent [19]
Bronstert

[11] Patent Number: 4,957,852
[45] Date of Patent: Sep. 18, 1990

[54] HOT EMBOSSING PLATES CROSSLINKABLE BY PHOTOPOLYMERIZATION

[75] Inventor: Bernd Bronstert, Otterstadt, Fed. Rep. of Germany

[73] Assignee: BASF Aktiengesellschaft, Ludwigshafen, Fed. Rep. of Germany

[21] Appl. No.: 205,343

[22] Filed: Jun. 10, 1988

[30] Foreign Application Priority Data

Jun. 13, 1987 [DE] Fed. Rep. of Germany ....... 3719871

[51] Int. Cl.$^5$ ............................ G03C 1/70; G03C 5/16
[52] U.S. Cl. ..................................... 430/283; 430/287; 430/325; 522/109; 522/110; 522/116; 522/117
[58] Field of Search ................ 430/283; 522/109, 110, 522/116, 117

[56] References Cited

U.S. PATENT DOCUMENTS 4,209,581 6/1980 Takanashi et al. ............. 522/116 X
4,517,277 5/1985 Lynch et al. .

FOREIGN PATENT DOCUMENTS 0224164 6/1987 European Pat. Off. .
0226079 6/1987 European Pat. Off. .
0815277 6/1959 United Kingdom .

OTHER PUBLICATIONS

Derwent Abstract of Japanese Application (Kokai) 124730/1982.

Primary Examiner—Paul R. Michl
Assistant Examiner—Cynthia Hamilton
Attorney, Agent, or Firm—Keil & Weinkauf

[57] ABSTRACT

In hot embossing plates which are crosslinkable by photopolymerization and comprise
(a) a heat-stable, dimensionally stable base and
(b) a relief-forming layer which is crosslinkable by photopolymerization and soluble or dispersible in water and contains
   ($b_1$) one or more partially or virtually completely hydrolyzed polyvinyl alkanecarboxylates as binders,
   ($b_2$) one or more alkenecarbonylamino-N-methylene ethers of polyhydric alcohols as photopolymerizable monomers and
   ($b_3$) photopolymerization initiators,
the relief-forming layer (b) contains, as further binders ($b_1$),
   ($b_{11}$) alkenecarboxylates and/or alkenecarbonylamino-N-methylene ethers of partially or virtually completely hydrolyzed polyvinyl alkanecarboxylates and/or
   ($b_{12}$) alkenecarboxylates and/or alkenecarbonylamino-N-methylene ethers of partially or virtually completely hydrolyzed graft copolymers of vinyl alkanecarboxylates and alkylene oxides,
and is more than 0.8 mm thick.

23 Claims, No Drawings

HOT EMBOSSING PLATES CROSSLINKABLE BY PHOTOPOLYMERIZATION

The present invention relates to novel hot embossing plates which have improved performance characteristics, are crosslinkable by photopolymerization and contain (a) a heat-stable, dimensionally stable base and
(b) a relief-forming layer which is crosslinkable by photopolymerization and soluble or dispersible in water, the relief-forming layer (b) containing
  ($b_1$) one or more partially or virtually completely hydrolyzed polyvinyl alkanecarboxylates as binders,
  ($b_2$) one or more alkenecarbonylamino-N-methylene ethers of polyhydric alcohols as photopolymerizable monomers and
  ($b_3$) photopolymerization initiators.

The term polyvinyl alcohol has become established for partially or virtually completely hydrolyzed homo- and copolymers of vinyl alkanecarboxylates and for graft copolymers based on these. The term is used below in this context for the sake of brevity. The alkenecarboxylates and the alkenecarbonylamino-N-methylene ethers of polyvinyl alcohols are also referred to below as polyvinyl alcohol derivatives for the sake of brevity.

The term partially hydrolyzed indicates that from 40 to 98 mol % of the alkanecarboxylate groups originally present in the polymers have been hydrolyzed to hydroxyl groups. Accordingly, the term virtually completely hydrolyzed designates a degree of hydrolysis of more than 98 mol %.

Hot embossing plates are used for impressing image information in other materials at elevated temperatures. For example, they are used for embossing board patterns for newspaper printing by means of stereos, for embossing plastic films, for example of polyvinyl chloride, or for embossing pattern plates which are employed for the production of flexographic printing plates.

Water-soluble mixtures which are crosslinkable by photopolymerization and based on polyvinyl alcohol and on (meth)acrylamido-N-methylene ethers of polyhydric alcohols are disclosed in JP-A-124730/82.

Furthermore, U.S. Pat. No. 4 517 277 discloses mixtures based on polyvinyl alcohol, polyvinyl alkenecarboxylates and acrylates or methacrylates.

Moreover, EP-A 226 079 discloses monomer-free mixtures of alkenecarbonylamino-N-methylene ethers of polyvinyl alcohol.

The known water-soluble or water-dispersible mixtures of the type under discussion, which are crosslinkable by photopolymerization, are generally used for the production of relief-forming layers of photopolymerizable recording materials. These known recording materials are used in particular for the production of printing plates, relief plates or photoresist images which are crosslinked by photopolymerization. They are however suitable only to a limited extent, if at all, for the production of hot embossing plates, because, after imagewise exposure and development, they do not have the great hardness and heat stability required for embossing purposes. Furthermore, the relief-forming layers of the known recording materials have poor exposure properties in a thickness required for hot embossing plates, so that image-bearing originals can be reproduced only poorly if at all.

It is an object of the present invention to provide novel hot embossing plates which have improved performance characteristics, are crosslinkable by photopolymerization and no longer have the disadvantages of hot embossing plates based on the known photopolymerizable recording materials.

We have found that this object is achieved by hot embossing plates crosslinkable by photopolymerization, and which comprise
(a) a heat-stable, dimensionally stable base
(b) a relief-forming layer which is crosslinkable by photopolymerization and soluble or dispersible in water and contains
  ($b_1$) one or more partially or virtually completely hydrolyzed polyvinyl alkanecarboxylates as binders,
  ($b_2$) one or more alkenecarbonylamino-N-methylene ethers of polyhydric alcohols as photopolymerizable monomers and
  ($b_3$) photopolymerization initiators, wherein the relief-forming layer (b) contains, as further binders ($b_1$),
  ($b_{11}$) alkenecarboxylates and/or alkenecarbonylamino-N-methylene ethers of partially or virtually completely hydrolyzed polyvinyl alkanecarboxylates and/or
  ($b_{12}$) alkenecarboxylates and/or alkenecarbonylamino-N-methylene ethers of partially or virtually completely hydrolyzed graft copolymers of vinyl alkanecarboxylates and alkylene oxides,
and is more than 0.8 mm thick.

In view of the prior art, it was surprising that the novel hot embossing plates are very suitable for the production of particularly thick, hard and at the same time heat-stable hot embossing matrices.

An essential component of the novel hot embossing plate is its relief-forming layer (b) which is crosslinkable by photopolymerization and soluble or dispersible in water.

This layer (b) is more than 0.8 mm thick. According to the invention, a thickness of from 0.9 to 2 mm, preferably from 1 to 1.7 mm, in particular from 1.3 to 1.6 mm, is advantageous.

According to the invention, the layer (b) contains, in addition to one or more partially or virtually completely hydrolyzed polyvinyl alkanecarboxylates, such as polyvinyl acetate, propionate or butyrate [polyvinyl alcohol, binder ($b_1$)], further binders ($b_{11}$) and/or ($b_{12}$) (polyvinyl alcohol derivatives). These polyvinyl alcohol derivatives ($b_{11}$) and ($b_{12}$) are known per se and are prepared by polymer-analogous esterification of polyvinyl alcohols with alkenecarboxylic anhydrides or by polymer-analogous etherification of polyvinyl alcohols with, for example, N-methylolalkenecarboxamides.

The polyvinyl alcohols ($b_1$) which are soluble or dispersible in water are advantageously used for this purpose, the said polyvinyl alcohols containing repeating 1-hydroxyeth-1,2-ylidene units

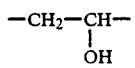

in the polymer chain and having number average molecular weights $\overline{M}_n$ of from $10^4$ to $10^5$, in particular from $1.5 \times 10^4$ to $5 \times 10^4$, for example partially or virtually completely hydrolyzed polyvinyl acetate or propionate having a degree of hydrolysis of from 60 to 99%, preferably from 70 to 98%, in particular from 75 to 95%. Alternatively, the partially or virtually completely hydrolyzed alkylene oxide/vinyl alkanecarboxylate graft copolymers ($b_1$) are used for this purpose, in particular those which are obtained by grafting vinyl acetate or propionate onto polyethylene oxide and then carrying out hydrolysis and which consist of from 10 to 30% by weight of 1-oxaprop-1,3-ylidene units

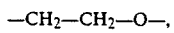

from 0 to 30% by weight of 1-acetyleth-1,2-ylidene units

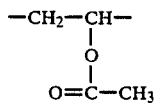

and from 90 to 40% by weight of 1-hydroxyeth-1,2-ylidene units, the percentages in each case being based on the graft copolymer.

These polyvinyl alcohols ($b_1$) can be reacted individually or as a mixture to give the polyvinyl alcohol derivatives ($b_{11}$) and ($b_{12}$).

The polymer-analogous esterification of these polyvinyl alcohols ($b_1$) is carried out in a conventional manner by dispersing the polyvinyl alcohols in an aprotic liquid, adding an alkenecarboxylic anhydride in excess and a catalyst and heating the resulting reaction mixture for a few hours at from 40° to 100° C., after which the polyvinyl alcohol derivatives ($b_{11}$) or ($b_{12}$) are filtered off, washed and dried. In general, from 1 to 20 mol % of the hydroxyl groups of the polyvinyl alcohol are converted in this manner.

Examples of alkenecarboxylic anhydrides which are suitable for this purpose are acrylic anhydride, methacrylic anhydride and maleic anhydride.

Examples of catalysts which are suitable for this purpose are N-alkylimidazoles, such as N-methylimidazole or N-ethylimidazole.

The polymer-analogous etherification of the polyvinyl alcohols ($b_1$) with N-methylol-, N-methoxymethyl- or N-ethoxymethylamides of alkenecarboxylic acids of 3 to 10 carbon atoms, for example crotonic acid, maleic acid, acrylic acid or methacrylic acid, can be carried out as described in EP-A 226 079. This procedure generally gives polyvinyl alcohol derivatives ($b_{11}$) or ($b_{12}$) in which from 1 to 20 mol % of the hydroxyl groups have been converted.

In the relief-forming layers (b) of the novel hot embossing plates, the binders ($b_{11}$) and/or ($b_{12}$) are present in an amount of from 10 to 90, advantageously from 15 to 80, in particular from 20 to 70, % by weight, based on the total binders ($b_1$) plus ($b_{11}$) and/or ($b_{12}$). The ratio of the binders ($b_{11}$) to ($b_{12}$) can be varied freely. For example, the binder ($b_{11}$) or the binder ($b_{12}$) may be present alone. It is however also possible to use ($b_{11}$) and ($b_{12}$) together. It is particularly advantageous if the ratio of ($b_{11}$) to ($b_{12}$) is greater than 1, preferably greater than 3, in particular greater than 5. It is very particularly advantageous to use only the binder ($b_{11}$) together with the binder ($b_1$).

In addition to the binders ($b_1$) and ($b_{11}$) and/or ($b_{12}$), the relief-forming layers (b) of the novel hot embossing plates contain one or more alkenecarbonylamino-N-methylene ethers of polyhydric alcohols as monomers ($b_2$). Their preparation is disclosed in -JP-A-124730/82.

Examples of suitable alkenecarbonylamino-N-methylene ethers are ethyleneglycolbis-, propanediolbis-, butanediolbis-, diethyleneglycolbis-, glyceroltris- and pentaerythritoltetrakis-(methacrylamido-N-methylene) ether and the corresponding acrylamido-N-methylene ethers, of which glyceroltris-(methacrylamido-N-methylene) ether is particularly advantageous.

In the relief-forming layers (b), the monomers ($b_2$) are present in an amount of from 20 to 60, preferably from 25 to 55, in particular from 30 to 50, parts by weight per 100 parts by weight of the total binder ($b_1$) plus ($b_{11}$) and/or ($b_{12}$).

The relief-forming layers (b) of the novel hot embossing plates furthermore contain conventional photoinitiators ($b_3$), such as benzildimethylacetal or 2,4,6-trimethylbenzoyldiphenylphosphine oxide, in an amount of from 0.1 to 15, preferably from 0.5 to 10, in particular from 1 to 6, parts by weight per 100 parts by weight of the total binder ($b_1$) plus ($b_{11}$) and/or ($b_{12}$).

Accordingly, very particularly advantageous relief-forming layers (b) essentially contain 100 parts by weight of binder, the proportion of binder ($b_1$) herein being from 30 to 80 parts by weight and the proportion of binder ($b_{11}$) herein being from 70 to 20 parts by weight, from 30 to 50 parts by weight of glyceroltris-(methacryl-amido-N-methylene) ether ($b_2$) and from 1 to 6 parts by weight of a photopolymerization initiator ($b_3$).

The relief-forming layers (b) of the novel hot embossing plates may also contain further suitable additives, such as conventional thermal polymerization inhibitors, dyes, pigments, plasticizers, antioxidants, photochromic substances, agents for improving the relief structure, crosslinking assistants, fluxes, mold release agents, fillers and/or reinforcing fillers, in effective amounts.

The production of relief-forming layers (b) of the novel hot embossing plates from their components does not involve any special methods, and the conventional kneading, mixing and dissolving techniques can be used for mixing the components. The resulting mixtures can then be shaped into layers (b) of the desired thickness in a conventional manner by casting from a solution, hot-pressing, calendering or extrusion.

Another essential component of the novel hot embossing plates is the heat-stable and dimensionally stable base (a). From 0.2 to 2 mm thick sheets of metals, such as steel, aluminum, copper or nickel, are suitable for this purpose.

In the novel hot embossing plates, the relief-forming layer (b) is advantageously firmly bonded to the base (a).

Furthermore, a top layer (TL) and/or a cover sheet (CS) can be applied to that side of the layer (b) which faces away from the base (a). If a top layer (TL) and a cover sheet (CS) are used together, (TL) is directly on top of the layer (b), and an antiadhesion layer (AL) may also be present between (TL) and (CS). Moreover, a firm bond may be obtained between the base (a) and the layer (b) with the aid of an adhesion-promoting layer (AP).

Suitable adhesion-promoting layers (AP) are conventional 0.5–40 μm thick layers of a mixture of adhesive-forming components.

Conventional top layers (TL) are from 0.5 to 20 μm thick and may consist of a polymer which forms soluble, nontacky, transparent and strong films, for example polyamide, amide copolymers, polyurethane, polyvinyl alcohol, polyvinyl pyrrolidone, polyethyelene oxide having a molecular weight greater than 105 or cyclized rubber having a high degree of cyclization. If necessary, (TL) may be matt.

Conventional cover sheets (CS) are from 20 to 150 μm thick and consist of a polymer such as polyamide or polyethylene terephthalate.

Conventional antiadhesion layers (AL) are from 0.1 to 0.5 μm thick and consist of, for example, silicone resins.

If highly reflective sheets are used as bases (a), conventional antihalation agents, such as carbon black, manganese dioxide or non-migrating dyes or pigments may be applied to their surface, as a separate layer. The antihalation agents can, however, also be present in the adhesion-promoting layer (AP) or in the relief-forming layer (b).

The production of the novel hot embossing plates does not involve any special methods. Usually, the plates are produced by applying the relief-forming layer (b) to the base (a) by casting from solution, hot pressing, calendering or extrusion. The other layers can then be applied to this two-layer element in a conventional manner. However, it is also possible first to apply the layer (b) to that side of a cover sheet (CS) which is covered with a top layer (TL) and then firmly to bond the uncovered side of the layer (b) to the base (a).

Crosslinked hot embossing matrices are produced from the novel hot embossing plates in a conventional manner by photopolymerization. The production does not involve any special methods but is carried out, if necessary after a pretreatment, by imagewise exposure of the hot embossing plates to actinic light having a wavelength λ of from 300 to 450 nm, advantageously from 320 to 420 nm, through a photographic negative placed on top, washing out of the unexposed and therefore uncrosslinked parts of the hot embossing plate with water or a water/alcohol mixture and drying of the hot embossing matrices which are obtained in this manner. The hot embossing plates crosslinked by photopolymerization now contain a relief layer (b'). An aftertreatment may follow.

A conventional pretreatment comprises, for example, removing any cover sheet (CS) present.

Conventional aftertreatments are uniform post-exposure or drying of the hot embossing matrices crosslinked by photopolymerization.

Suitable sources of actinic light are, for example, commerical UV fluorescence tubes, medium pressure, high pressure and low pressure mercury lamps, superactinic fluorescent tubes, pulsed xenon lamps, metal iodide-doped lamps and carbon arc lamps.

The thickness of the relief layer (b') of the resulting hot embossing matrices is in general greater than 0.8 mm; thicknesses of from 0.9 to 2 mm, preferably from 1 to 1.7 mm, in particular from 1.3 to 1.6 mm, are advantageous.

In their production and processing, the novel hot embossing plates have a large number of particular unexpected advantages. For example, because of the high heat stability of their relief-forming layer (b), they can be very easily produced and processed by conventional methods without special precautions being required. They have a long shelf life and can be disposed of in an environmentally compatible manner.

The hot embossing plates can be exposed and developed in a shorter time than the corresponding known products, so that, overall, shorter process times and hence higher space/time yields result during the production of the hot embossing matrices. Moreover, the drying times for the exposed and developed hot embossing matrices can be reduced because their excellent performance characteristics are not adversely affected by a comparatively high residual water content in the relief layers (b').

Furthermore, the relief layers (b') of the hot embossing matrices are so hard, heat-stable and dimensionally stable that they are not adversely affected even after they have been used 10 times for hot embossing.

EXAMPLE 1

Preparation of polyvinyl alcohol derivatives (binders $b_{11}$ and $b_{12}$)

For the further Examples and Comparative Experiments, partially esterified and partially etherified polyvinyl alcohols were prepared by the following methods:

1.1 Preparation of a polyvinyl methacrylate (binder $b_{11}$)

1,000 kg of a partially hydrolyzed polyvinyl acetate (degree of hydrolysis: 82 mol %, number average molecular weight $\overline{M}_n$: $2 \times 10^4$) were dispersed in a mixture of 1,800 kg of toluene, 165 kg of methacrylic anhydride (containing 3.5% of methacrylic acid as an impurity), 10 kg of 2,6-di-tert-butyl-p-cresol and 5 kg of N-methylimidazole. The resulting mixture was stirred for 8 hours at 90° C., after which the reaction product formed was filtered off, washed with toluene and acetone and then dried. It contained 5.5% by weight of methacrylate groups and was free of byproducts and virtually colorless.

1.2 Preparation of a polyvinyl methacrylate (binder $b_{12}$)

The procedure described in (1.1) was followed, except that, instead of the partially hydrolyzed polyvinyl acetate, a partially hydrolyzed ethylene oxide/vinyl acetate graft copolymer having a number average molecular weight $\overline{M}_n$ of $2 \times 10^4$ and consisting of 25% by weight of 1-oxaprop-1,3-ylidene, 25% by weight of 1-acetyleth-1,2-ylidene and 50% by weight of 1-hydroxyeth-1,2-ylidene units was used, the percentages being based on the graft copolymer. The resulting reaction product contained 6.1% by weight of methacrylate groups and was free of byproducts.

1.3 Preparation of an acrylamido-N-methylene ether of a polyvinyl alcohol (binder $b_{11}$)

100 kg of the polyvinyl alcohol from (1.1) together with 2 kg of 2,6-di-tert-butyl-p-cresol, 2 kg of 69% strength aqueous phosphoric acid and 18.7 kg of N-methylolacrylamide were dissolved in 130 kg of water. The resulting solution was passed via a thin-film evaporator, where it was concentrated, and was then poured onto metal sheets. The wet films thus obtained were dried, heated at 100° C. for 1 hour and then comminuted. The comminuted product was dissolved in 0.07% strength aqueous sodium hydroxide solution, and the unconverted N-methylolacrylamide was separated therefrom by dialysis. Thereafter, the purified product was precipitated from the solution by adding an acid and was isolated and dried.

The IR spectrum of the partially etherified polyvinyl alcohol showed the bands of the acrylamide groups at 1,650, 1,620 and 1,520 cm$^{-1}$. The yield of methylene ether groups was 62%, based on N-methylolacrylamide, corresponding to a content of about 10% by weight of acrylamido-N-methylene groups in the reaction product.

1.4 Preparation of a methacrylamido-N-methylene ether of a polyvinyl alcohol (binder b$_{12}$)

The procedure was essentially the same as that in (1.3), except that, instead of the polyvinyl alcohol used there and the N-methylolacrylamide, the polyvinyl alcohol from (1.2) and N-methylolmethacrylamide were used.

The reaction product contained 11% by weight of methacrylamido-N-methylene groups.

EXAMPLE 2

Production of hot embossing plates and matrices; production method

The relief-forming layers (b) of the novel hot embossing plates were produced by dissolving their components in water/isopropanol (volume ratio 70:30). Table 1 gives information about the type and proportions of the components.

The solutions were cast onto 1 mm thick, 25 cm wide and 30 cm long aluminum sheets and dried to give relief-forming layers (b) which were 1.5 mm thick when dry.

placed in a heatable embossing press and preheated to 140°-150° C. for 2 minutes under minimum contact pressure. Thereafter, the two rams were driven against one another under a constant pressure of 20 tonnes, the pressure always being taken up by two spacer strips placed adjacent to the patterns, so that the depth of penetration of the surface of the hot embossing matrices into the patterns was 1.6 mm in each case. The patterns, in contact with the hot embossing matrices were then cured in the embossing press at about 145° C. for 18 minutes. After removal of the hot embossing matrices, excellently formed patterns were obtained, onto which sheet-like rubber layers were then pressed in a conventional manner. The said rubber layers now contained reliefs, whose quality and faithfulness to detail completely matched the original relief layers (b') of the hot embossing matrices. The rubber layers were vulcanized to give rubber plates for flexographic printing. During printing on a commercial printing unit, the rubber plates reproduced in an excellent manner the information contained in the image-bearing original and transferred to the said rubber plates via the novel hot embossing plates. Even the finest image elements were very clean and exact.

The image information of the four hot embossing matrices could be transferred to the rubber plates without deformation or loss of information, even after 20 embossing processes.

TABLE 1

| | Hot embossing plates according to the invention | | | | |
|---|---|---|---|---|---|
| Relief-forming layer (b) and hot embossing plate No. | Polyvinyl alcohol derivative (No.) Parts by weight | Polyvinyl alcohol[1] Parts by wt. | Monomer[2] Parts by wt. | Photo-initiator[3] Parts by wt. | Thermal polymerization inhibitor[4] Parts by weight |
| 2.1 | (1.1) 62.5 | 37.5 | 43.7 | 3.75 | 0.625 |
| 2.2 | (1.2) 62.5 | 37.5 | 43.7 | 3.75 | 0.625 |
| 2.3 | (1.3) 62.5 | 37.5 | 43.7 | 3.75 | 0.625 |
| 2.4 | (1.4) 62.5 | 37.5 | 43.7 | 3.75 | 0.625 |

[1]Partially hydrolyzed polyvinyl acetate, degree of hydrolysis 80%, number average molecular weight $\overline{M}_n$: 2 × 10$^4$
[2]Glyceroltris-(methacrylamido-N—methylene) ether
[3]Benzil dimethylacetal
[4]Potassium salt of N—nitrosocyclohexylhydroxylamine The resulting hot embossing plates (2.1) to (2.4) in Table 1 were exposed imagewise through a standard negative for 6 minutes in a flat-plate exposure unit containing superactinic fluorescent tubes and then developed with tap water in a flow-through washer for 7 minutes. Thereafter, the hot embossing matrices were dried for 2 hours.

The hot embossing matrices (2.1) to (2.4) crosslinked by photopolymerization (Table 1) were used for embossing rubber plates typically used for flexographic printing. For this purpose, the hot embossing matrices were first pretreated with a commercial mold release agent based on talc. Each of the hot embossing plates, together with a commercial hot embossing pattern based on a fiber board impregnated and coated with a phenol resin (thickness of coating 1.3 mm), were then

COMPARATIVE EXPERIMENT

Production of hot embossing plates not according to the invention

The procedure was essentially the same as that in Example 2, except that the relief-forming layers had the compositions stated in Table 2.

The hot embossing plates V1 to V4 crosslinked by photopolymerization were unsuitable for the production of typical rubber flexographic printing plates by hot embossing, because cracks and deformations and hence loss of information occurred as early as the first embossing process.

The hot embossing matrix V1 furthermore showed unsatisfactory formation of very fine relief dots and lines.

TABLE 2

| | Hot embossing plates based on known relief-forming layers (Comparative Experiments) | | | | |
|---|---|---|---|---|---|
| Relief-forming layer and hot embossing plate No. | Polyvinyl alcohol derivative (No.) Parts by weight | Polyvinyl alcohol[1] Parts by wt. | Monomer Parts by wt. | Photo-initiator[4] Parts by wt. | Thermal polymerization inhibitor[5] Parts by weight |
| V 1 | — | 100 | 53.8[2] | 3.7 | 0.625 |
| V 2 | (1.1) 61.5 | 38.5 | 53.8[3] | 3.7 | 0.625 |
| V 3 | (1.3) 100 | — | — | 3.7 | 0.625 |

TABLE 2-continued

| | Hot embossing plates based on known relief-forming layers (Comparative Experiments) | | | | |
|---|---|---|---|---|---|
| Relief-forming layer and hot embossing plate No. | Polyvinyl alcohol derivative (No.) Parts by weight | Polyvinyl alcohol[1] Parts by wt. | Monomer Parts by wt. | Photo-initiator[4] Parts by wt. | Thermal polymerization inhibitor[5] Parts by weight |
| V 4 | (1.4) 100 | — | — | 3.7 | 0.625 |

[1] Partially hydrolyzed polyvinyl acetate, degree of hydrolysis 80%, number average molecular weight $\bar{M}_n$: $2 \times 10^4$
[2] Glyceroltris-(methacrylamido-N—methylene) ether
[3] Tetraethylene glycol dimethacrylate
[4] Benzil dimethyl acetal
[5] Potassium salt of N-nitrosocyclohexylhydroxylamine

I claim:

1. A hot embossing plate crosslinkable by photopolymerization, comprising:
   (a) a heat-stable, dimensionally stable base; and
   (b) a relief-forming layer which is crosslinkable by photopolymerization, soluble or dispersible in water and more than 0.8 mm thick, the relief-forming layer (b) containing:
   ($b_1$) one or more partially or virtually completely hydrolyzed polyvinyl alkanecarboxylates as binders, and, as further binders,
      ($b_{11}$) alkenecarboxylates, or alkenecarbonylamino-N-methylene ethers of partially or virtually completely hydrolyzed polyvinyl alkanecarboxylates, or
      ($b_{12}$) alkenecarbonylamino-N-methylene ethers of partially or virtually completely hydrolyzed graft copolymers of vinyl alkanecarboxylates and alkylene oxides, or mixtures of $b_{11}$ and $b_{12}$; and furthermore
   ($b_2$) one or more alkanecarbonylamino-N-methylene ethers of polyhydric alcohols as photopolymerizable monomers; and
   ($b_3$) one or more photopolymerization initiators.

2. The hot embossing plate of claim 1, containing glyceroltries-(methacrylamido-N-methylene) ether as monomer ($b_2$).

3. A process for the production of a hot embossing matrix crosslinked by photopolymerization, comprising imagewise exposure of a hot embossing plate as claimed in claim 1 to actinic light, followed by development of the exposed plate with water.

4. A process for the production of a hot embossing matrix crosslinked by photopolymerization, comprising imagewise exposure of a hot embossing plate as claimed in claim 2 to actinic light, followed by development of the exposed plate with water.

5. The hot embossing plate of claim 1, wherein the relief forming layer has a thickness of from 0.9 to 2 mm thick.

6. The hot embossing plate of claim 5, wherein the thickness of the relief forming layer is from 1 to 1.7 mm.

7. The hot embossing plate of claim 6, wherein the thickness of the relief forming plate is from 1.3 to 1.6 mm.

8. The hot embossing plate of claim 1, wherein the binder $b_{11}$ is present in an amount of from 10 to 90% by weight based on the binders $b_1$, and $b_{11}$.

9. The hot embossing plate of claim 8, wherein the binder $b_{11}$ is present at from 15 to 80%.

10. The hot embossing plate of claim 9, wherein the binder $b_{11}$ is present at from 20 to 70%.

11. The hot embossing plate of claim 1, wherein the binders $b_{11}$ and $b_{12}$ together are present at from 10 to 90% by weight based on the total binders $b_1$, $b_{11}$ and $b_{12}$.

12. The hot embossing plate of claim 11, wherein the binders $b_{11}$ and $b_{12}$ are present at from 15 to 80%.

13. The hot embossing plate of claim 12, wherein the binders $b_{11}$ and $b_{12}$ are present at from 20–70%.

14. The hot embossing plate of claim 11, wherein the ratio of binders $b_{11}$ to $b_{12}$ is greater than 1.

15. The hot embossing plate of claim 14, wherein the ratio of binders $b_{11}$ to $b_{12}$ is greater than 3.

16. The hot embossing plate of claim 15, wherein the ratio of binders $b_{11}$ to $b_{12}$ is greater than 5.

17. The hot embossing plate of claim 1, wherein the alkenecarbonylamino-N-methylene ethers $b_2$ are selected from the group consisting of ethyleneglycolbis-, propanediolbis-, butanediolbis-, diethyleneglycolbis-, glyceroltris- and pentaerythritoltetrakis-(methacrylamido-N-methylene) ether and the corresponding acrylamido-N-methylene ethers.

18. The hot embossing plate of claim 17, wherein the alkenecarbonylamino-N-methylene ether is glyceroltris(methacrylamido-N-methylene) ether.

19. The hot embossing plate of claim 1, wherein the monomers $b_2$ are present at from 20 to 60 parts by weight per 100 parts by weight of the total binders $b_1$, $b_{11}$ and $b_{12}$.

20. The hot embossing plate of claim 19 having monomers $b_2$ present at from 25 to 55 parts by weight per 100 parts by weight of the total binders $b_1$, $b_{11}$ and $b_{12}$.

21. The hot embossing plate of claim 20 having monomers $b_2$ present at from 30 to 50 parts by weight per 100 parts by weight of the total binders $b_1$, $b_{11}$ and $b_{12}$.

22. The hot embossing plate of claim 1, wherein the relief forming layer b contains:
   (a) 100 parts by weight of a binder, which comprises:
      (i) from 30 to 80 parts by weight of binder $b_1$; and
      (ii) from 70 to 20 parts by weight of binder $b_{11}$;
   (b) from 30 to 50 parts by weight of glyceroltris(methacrylamido-N-methylene) ether ($b_2$); and
   (c) from 1 to 6 parts by weight of a photopolymerization initiator ($b_3$).

23. The hot embossing plate of claim 1, wherein the relief forming layer is from 1.3 to 1.6 mm thick, the binder $b_{11}$ is present at from 20 to 70% by weight based on the total binders $b_1$, and $b_{11}$, and the $b_2$ monomer is glyceroltris(methacrylamido-N-methylene) ether that is present at 30 to 50 parts by weight per 100 parts by weight of the total binders $b_1$, and $b_{11}$.

* * * * *